(12) United States Patent
Khadiwala et al.

(10) Patent No.: US 10,498,823 B2
(45) Date of Patent: Dec. 3, 2019

(54) OPTIMALLY APPORTIONING REBUILDING RESOURCES

(71) Applicant: International Business Machines Corporation, Armonk, NY (US)

(72) Inventors: Ravi V. Khadiwala, Bartlett, IL (US); Ethan S. Wozniak, Park Ridge, IL (US); Jason K. Resch, Chicago, IL (US); Thomas D. Cocagne, Elk Grove Village, IL (US)

(73) Assignee: PURE STORAGE, INC., Mountain View, CA (US)

( * ) Notice: Subject to any disclaimer, the term of this patent is extended or adjusted under 35 U.S.C. 154(b) by 38 days.

(21) Appl. No.: 15/837,401

(22) Filed: Dec. 11, 2017

(65) Prior Publication Data

US 2018/0103102 A1 Apr. 12, 2018

Related U.S. Application Data

(63) Continuation-in-part of application No. 15/812,706, filed on Nov. 14, 2017, now Pat. No. 10,362,111, which is a continuation of application No. 14/956,818, filed on Dec. 2, 2015, now Pat. No. 9,826,038.

(60) Provisional application No. 62/109,712, filed on Jan. 30, 2015.

(51) Int. Cl.
| | |
|---|---|
| *H03M 13/15* | (2006.01) |
| *H04L 29/08* | (2006.01) |
| *H03M 13/37* | (2006.01) |
| *H03M 13/09* | (2006.01) |

(52) U.S. Cl.
CPC .... *H04L 67/1097* (2013.01); *H03M 13/3761* (2013.01); *H03M 13/09* (2013.01); *H03M 13/1515* (2013.01)

(58) Field of Classification Search
CPC ...................................................... H03M 13/15
USPC ......................................... 714/759, 762, 758
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |

(Continued)

OTHER PUBLICATIONS

Chung; An Automatic Data Segmentation Method for 3D Measured Data Points; National Taiwan University; pp. 1-8; 1998.

(Continued)

*Primary Examiner* — Fritz Alphonse
(74) *Attorney, Agent, or Firm* — Garlick & Markison; Edward J. Marshall

(57) ABSTRACT

A distributed storage network (DSN) stores encoded data slices in storage units based on DSN address ranges. A rebuilding module selects a range of addresses for potential rebuilding activities. A rebuilding activity capacity level for the address range is determined, and using that information a maximum number of rebuilding modules to be assigned to the selected address range is determined. Distributed agreement protocol (DAP) function weights of the plurality of potential rebuilding modules are determined, and those weights are used by the DAP function to produce a rank ordered list of rebuilding module identifiers. Top ranked rebuilding modules are selected for use in rebuilding activities within the selected address range.

20 Claims, 10 Drawing Sheets

(56) References Cited

U.S. PATENT DOCUMENTS

| | | | |
|---|---|---|---|
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2014/0331086 A1* | 11/2014 | Resch | G06F 11/1458 714/15 |
| 2015/0227414 A1 | 8/2015 | Varma | |
| 2015/0288384 A1* | 10/2015 | Gladwin | G06F 11/1008 714/763 |
| 2015/0378822 A1* | 12/2015 | Grube | G06F 11/1092 714/763 |
| 2016/0117219 A1 | 4/2016 | Halbert et al. | |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): String Representation of Distinguished Names; IETF Network Working Group; RFC 4514; Jun. 2006; pp. 1-15.

* cited by examiner

OPTIMALLY APPORTIONING REBUILDING RESOURCES

CROSS-REFERENCE TO RELATED APPLICATIONS

The present U.S. Utility Patent Application claims priority pursuant to 35 U.S.C. § 120 as a continuation-in-part of U.S. Utility Application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility Application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility Patent Application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Conventional storage systems sometimes require stored data to be rebuilt, for example due to a memory hardware failure, or in the context of data migration. In some cases, multiple devices might attempt to rebuild the same data, which can result in inefficient use of system resources.

DETAILED DESCRIPTION

Figure 1:
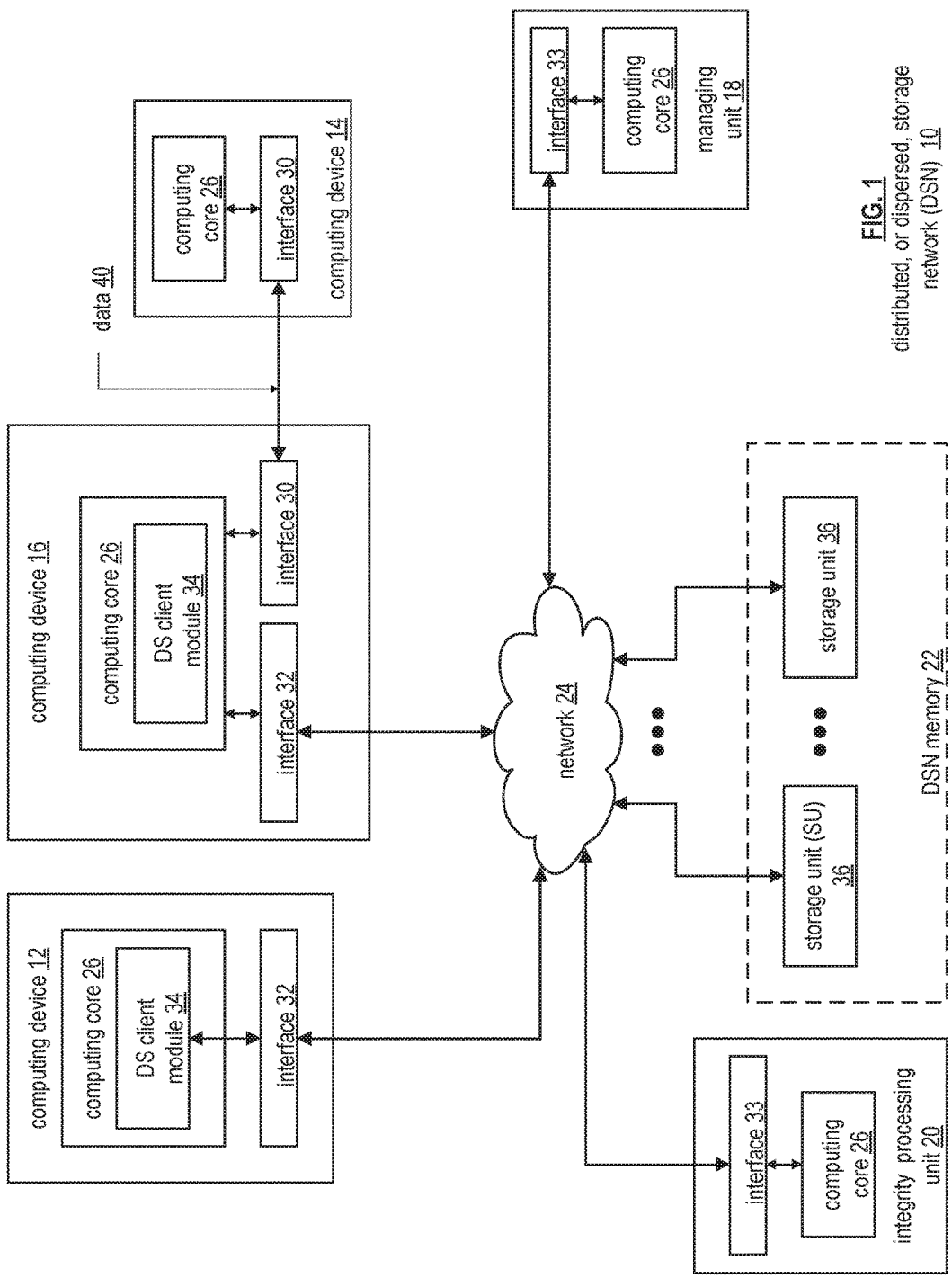
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
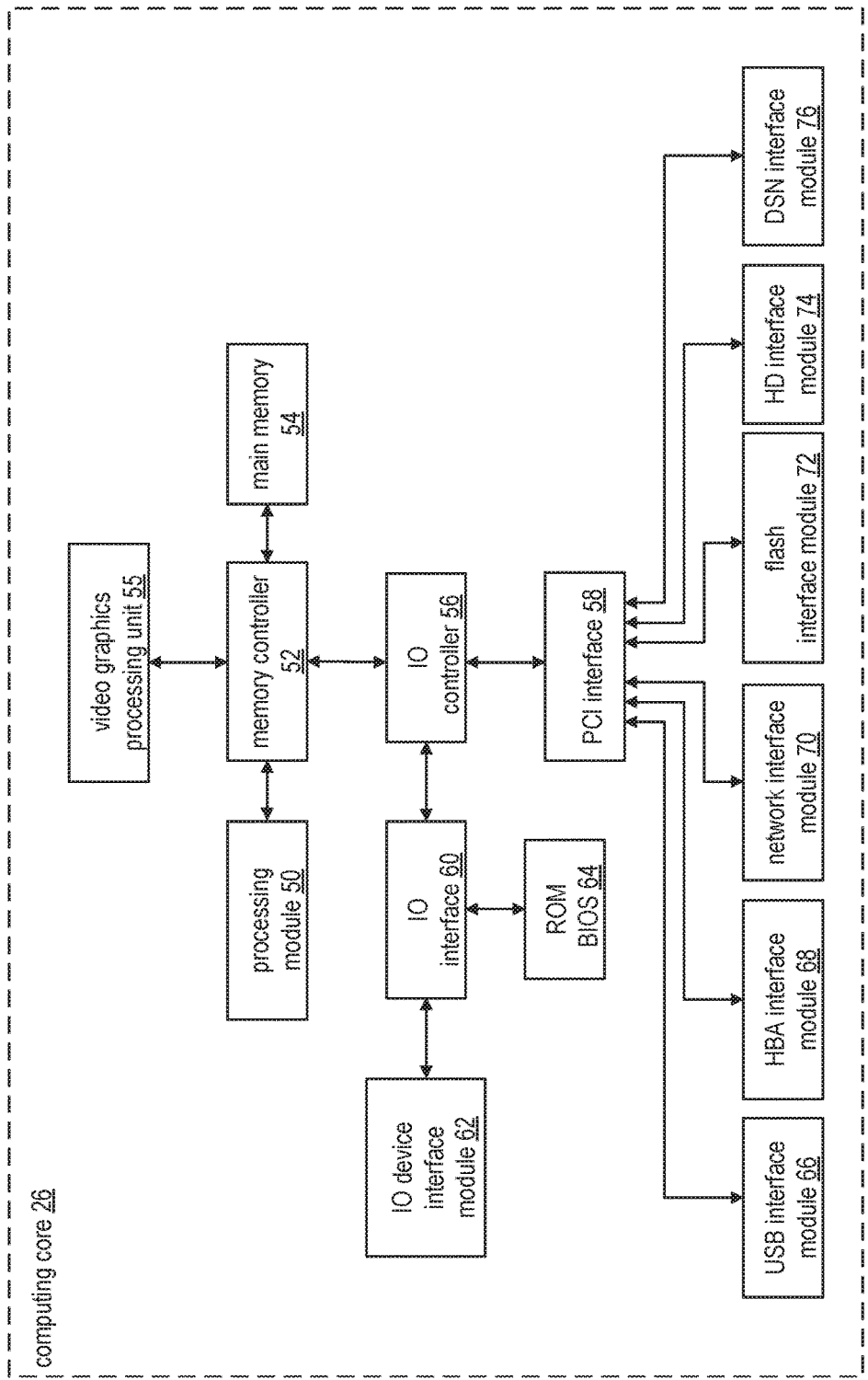
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4, 5, 6:
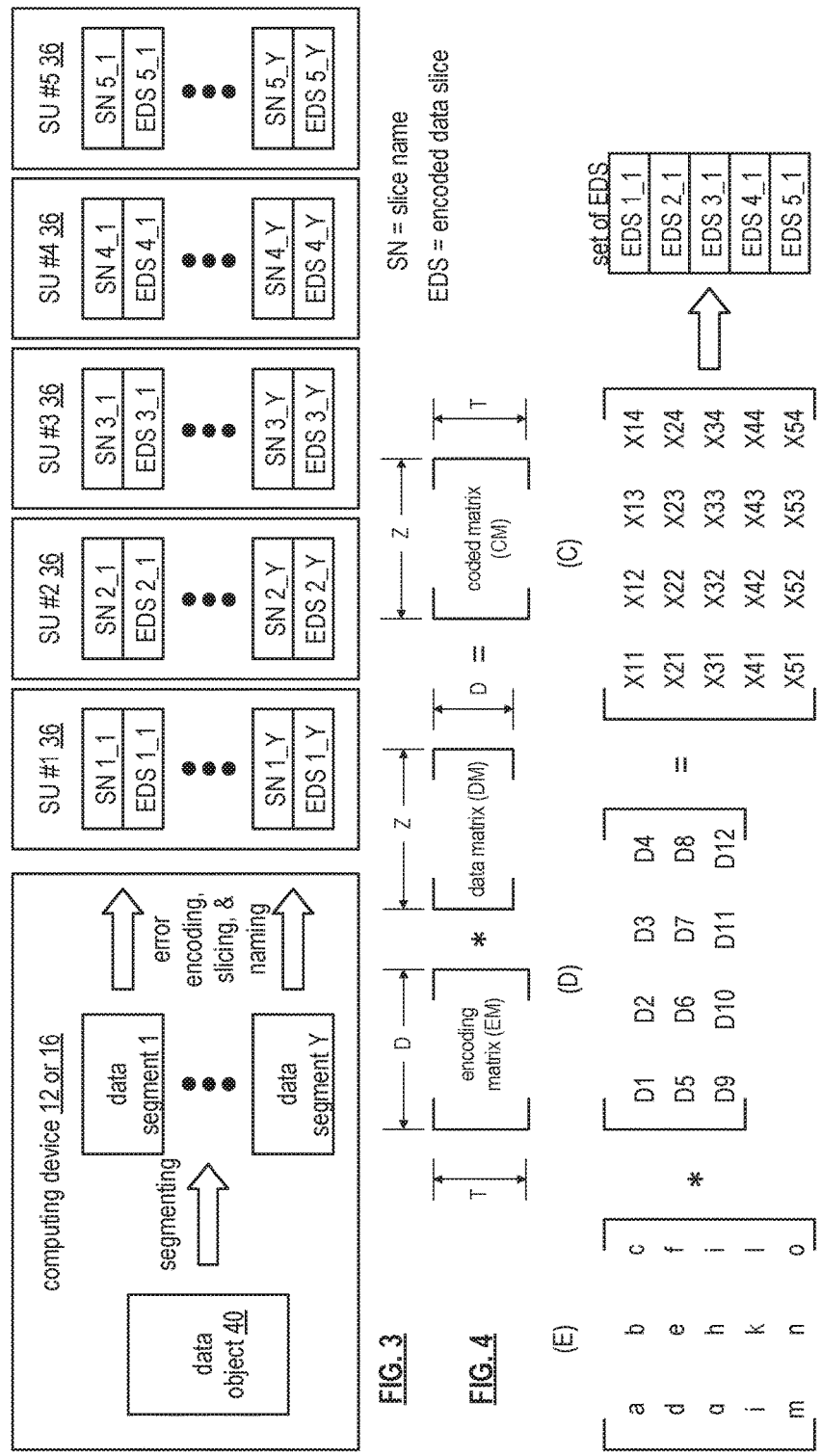
FIG. 3 is a schematic block diagram of an example of dispersed storage error encoding of data in accordance with the present invention.
FIG. 4 is a schematic block diagram of a generic example of an error encoding function in accordance with the present invention.
FIG. 5 is a schematic block diagram of a specific example of an error encoding function in accordance with the present invention.
FIG. 6 is a schematic block diagram of an example of a slice name of an encoded data slice (EDS) in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
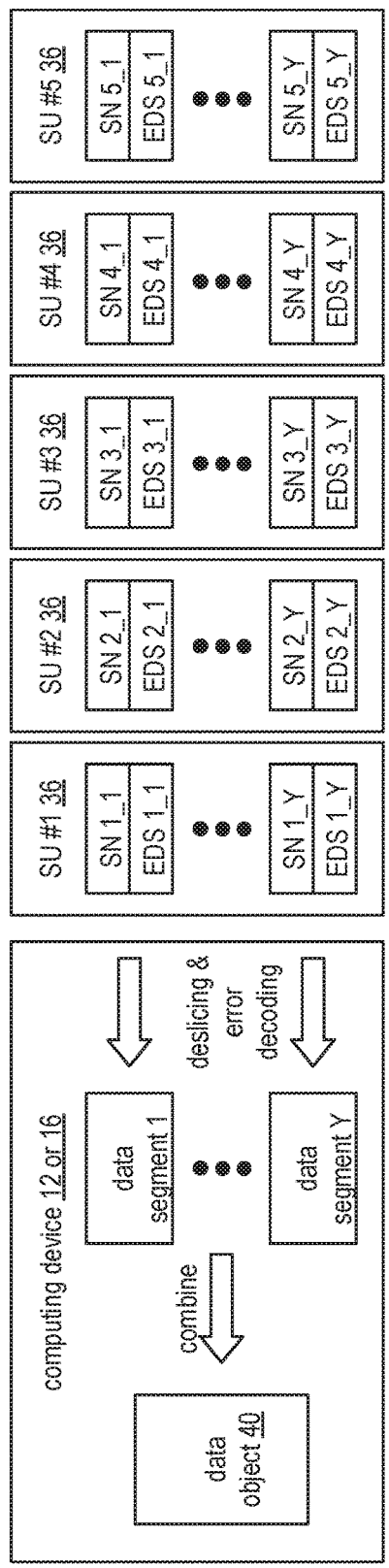
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
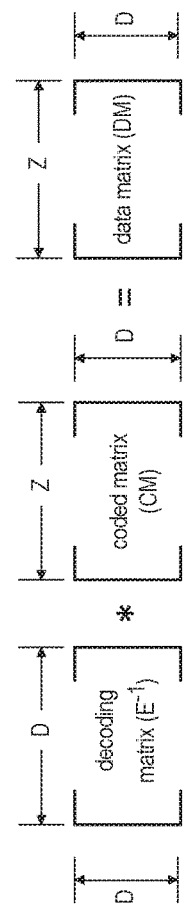
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Referring next to FIGS. 9-14, various embodiments providing for optimized selection and assignment of resources used in rebuilding encoded data slices stored in distributed storage (DS) are discussed. When rebuilding is prioritized, e.g. when the least healthy ranges of the namespace receive rebuild priority, without coordination all rebuild modules may attempt to rebuild the same limited set of DS units or failed memory devices. For example, if a given failed memory device can only rebuild at 10 MB/s and rebuild modules can rebuild slices at 5 MB/s, then it does not make sense for more than 3 rebuild modules to work on this same memory device at a time.

In various embodiments disclosed herein, to optimally apportion rebuilding resources, a prioritized list of namespace ranges to rebuild is formed, e.g. by ranking the namespaces, or devices used to store data in those namespaces, according to which are on the least healthy ranges. In some embodiments, namespace ranges or devices having the most missing or corrupted encoded data slices, namespace ranges having the most fragmentation, namespace ranges generating the most access errors, namespace ranges having the most failed memory devices, or the namespace ranges that are otherwise less optimally functional than other namespace ranges, can be considered the most unhealthy.

An estimation is created for the rebuild capacity of each range to be rebuilt. In some embodiments, a static listing (ordering) of rebuild modules may be applied against each range until that range's capacity is met by the capacity for the rebuilders to rebuild that range. However if the list is static, this may result in an unfair distribution (the stores at the top get selected the most). In other embodiments, a rendezvous hash algorithm, or similar distributed agreement protocol (DAP), is computed against the source name of the unhealthy range, to produce a uniquely determined ranking of rebuild modules. This ordered list is used for determining which rebuild modules ought to work on which slice name ranges. For example, if source range "FF023902," is the least healthy range, and has 2 slice name ranges (index 1 and index 5) to be rebuilt, each of these ranges can accommodate 2 rebuilders. In this example, a DAP may be used to compute the top 4 rebuild modules that should be assigned to the 2 slice name ranges for the source range starting with "FF023902." This can the rebuild rate for that range, while freeing other rebuild modules to address other parts of the system.

Figure 9:
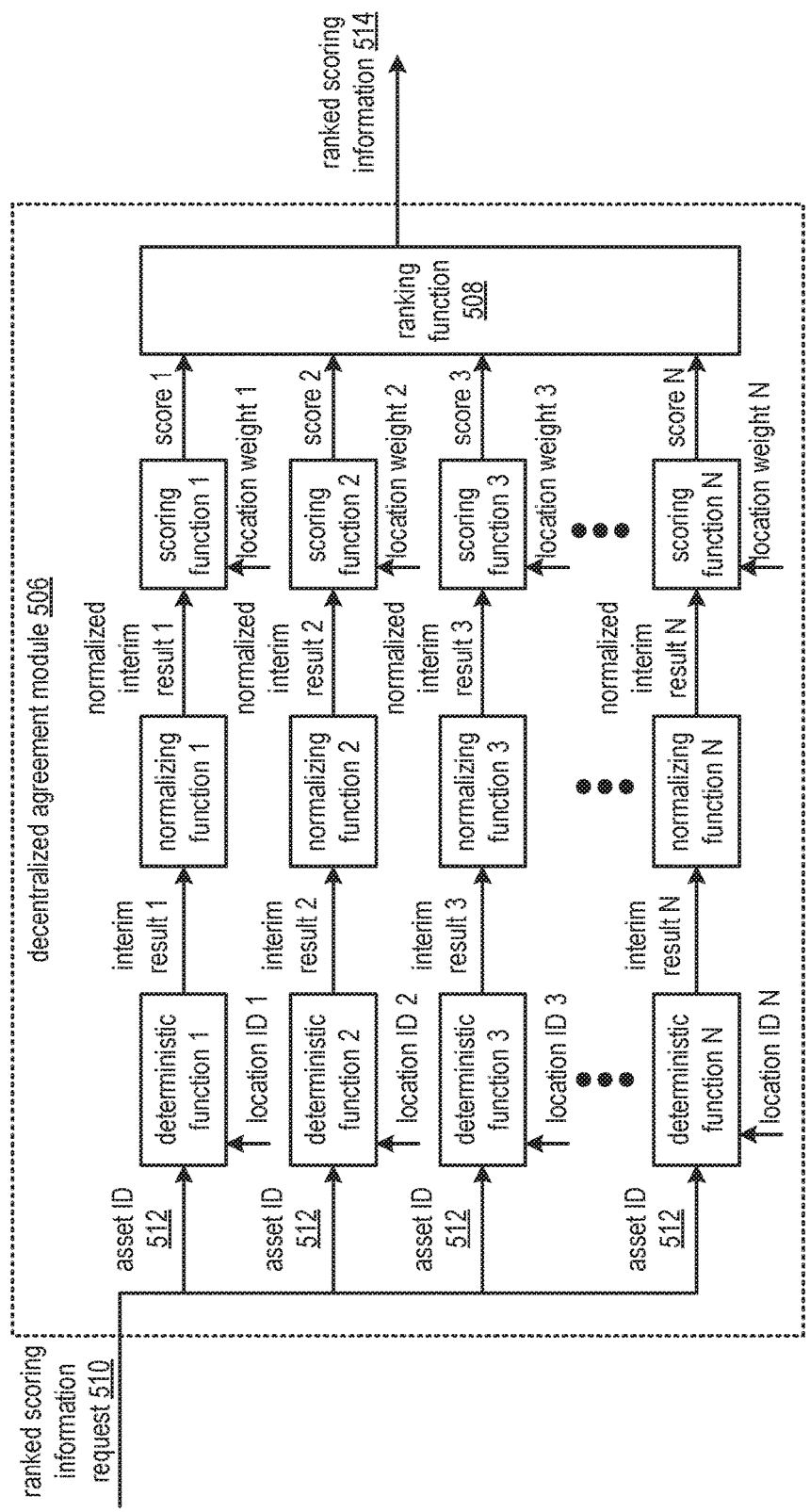
FIG. 9 is a schematic block diagram of an embodiment of a decentralized agreement module in accordance with the present invention.

FIG. 9 is a schematic block diagram of an embodiment of a decentralized agreement module 506 that includes a set of deterministic functions 1-N, a set of normalizing functions 1-N, a set of scoring functions 1-N, and a ranking function 508. Each of the deterministic function, the normalizing function, the scoring function, and the ranking function 508, may be implemented utilizing a processing module, such as computing core 26, included in one or more of the devices illustrated in FIG. 1, e.g. DSN memory 22, storage unit 36, integrity processing unit 20, managing unit 18, or any of the computing devices 12, 14, or 16. The decentralized agreement module 506 may be implemented utilizing any module and/or unit of a dispersed storage network (DSN). For example, the decentralized agreement module 506 can be implemented utilizing distributed storage (DS) client module 34 of FIG. 1.

The decentralized agreement module 506 functions to receive a ranked scoring information request 510 and to generate ranked scoring information 514 based on the ranked scoring information request 510 and other information. The ranked scoring information request 510 includes one or more of an asset identifier (ID) 512 of an asset associated with the request, an asset type indicator, one or more location identifiers of locations (e.g., modules, units) associated with the DSN, one or more corresponding location weights (e.g., weighting factor), and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 512 of the asset includes one or more of a data name, a data record identifier, a DSN address, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DS client module 34 of FIG. 1, a DST processing unit, such as computing device 16 of FIG. 1, an integrity processing unit 20 of FIG. 1, a managing unit 18 of FIG. 1, and a user device, such as computing devices 12 and 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others.

The other information may include a set of location identifiers and a set of location weights associated with the set of location identifiers. For example, the other information includes location identifiers and location weights associated with a set of memory devices of a storage unit when the requesting entity utilizes the decentralized agreement module to produce ranked scoring information with regards to a selection of a memory device of the set of memory devices for accessing a particular encoded data slice (e.g., where the asset ID includes a slice name of the particular encoded data slice).

The decentralized agreement module 506 outputs substantially identical ranked scoring information for each ranked scoring information request 510 that includes substantially identical content of the ranked scoring information request 510. For example, a first requesting entity issues a first ranked scoring information request to the decentralized agreement module 506 and receives first ranked scoring information. A second requesting entity issues a second ranked scoring information request to the decentralized agreement module 506 and receives second ranked scoring information. The second ranked scoring information is substantially the same as the first ranked scoring information when the second ranked scoring information request is substantially the same as the first ranked scoring information request.

As such, two or more requesting entities may independently utilize the decentralized agreement module 506 (e.g., or two agreement modules) to determine substantially identical ranked scoring information. As a specific example, the first requesting entity selects a first storage pool of a plurality of storage pools for storing a set of encoded data slices utilizing the decentralized agreement module and the second requesting entity identifies the first storage pool of the plurality of storage pools for retrieving the set of encoded data slices utilizing the decentralized agreement module.

In an example of operation, the decentralized agreement module 506 receives the ranked scoring information request 510. Each deterministic function performs a deterministic function on a combination and/or concatenation (e.g., add, append, interleave) of the asset ID 512 of the request and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID 512 to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 508 performs a ranking function on the set of scores 1-N to generate the ranked scoring information 514. Performing the ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 514, the decentralized agreement module 506 outputs the ranked scoring information 514 to the requesting entity.

Figure 10:
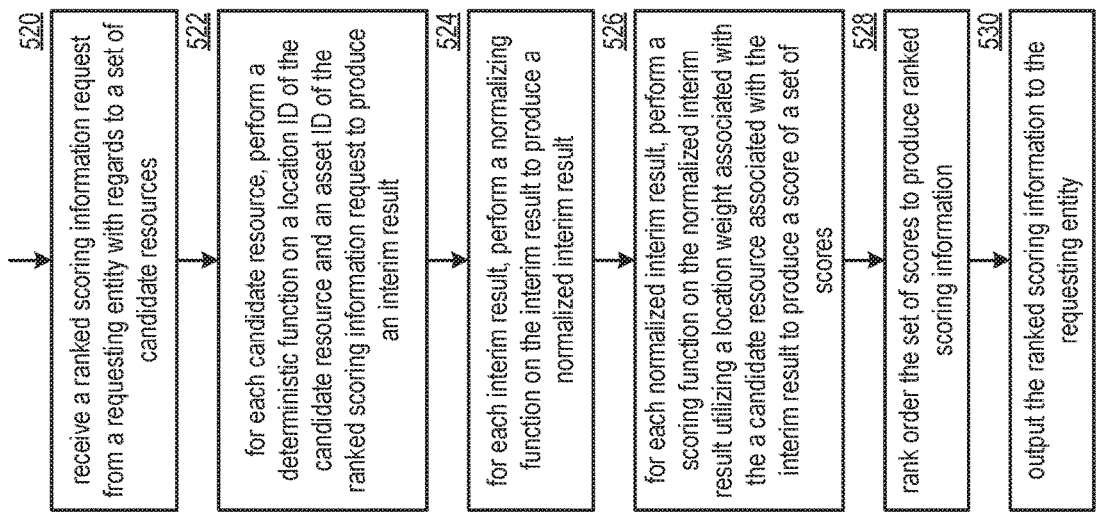
FIG. 10 is a flowchart illustrating an example of selecting a resource in accordance with the present invention.

FIG. 10 is a flowchart illustrating an example of selecting a resource. The method includes step 520 where a processing module (e.g., of a decentralized agreement module) receives a ranked scoring information request from a requesting entity with regards to a set of candidate resources. For each candidate resource, the method continues at step 522 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 524 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 526 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 528 where the processing module rank orders the set of scores to produce ranked scoring information (e.g., ranking a highest value first). The method continues at step 530 where the processing module outputs the ranked scoring information to the requesting entity. The requesting entity may utilize the ranked scoring information to select one location of a plurality of locations.

Figure 11:
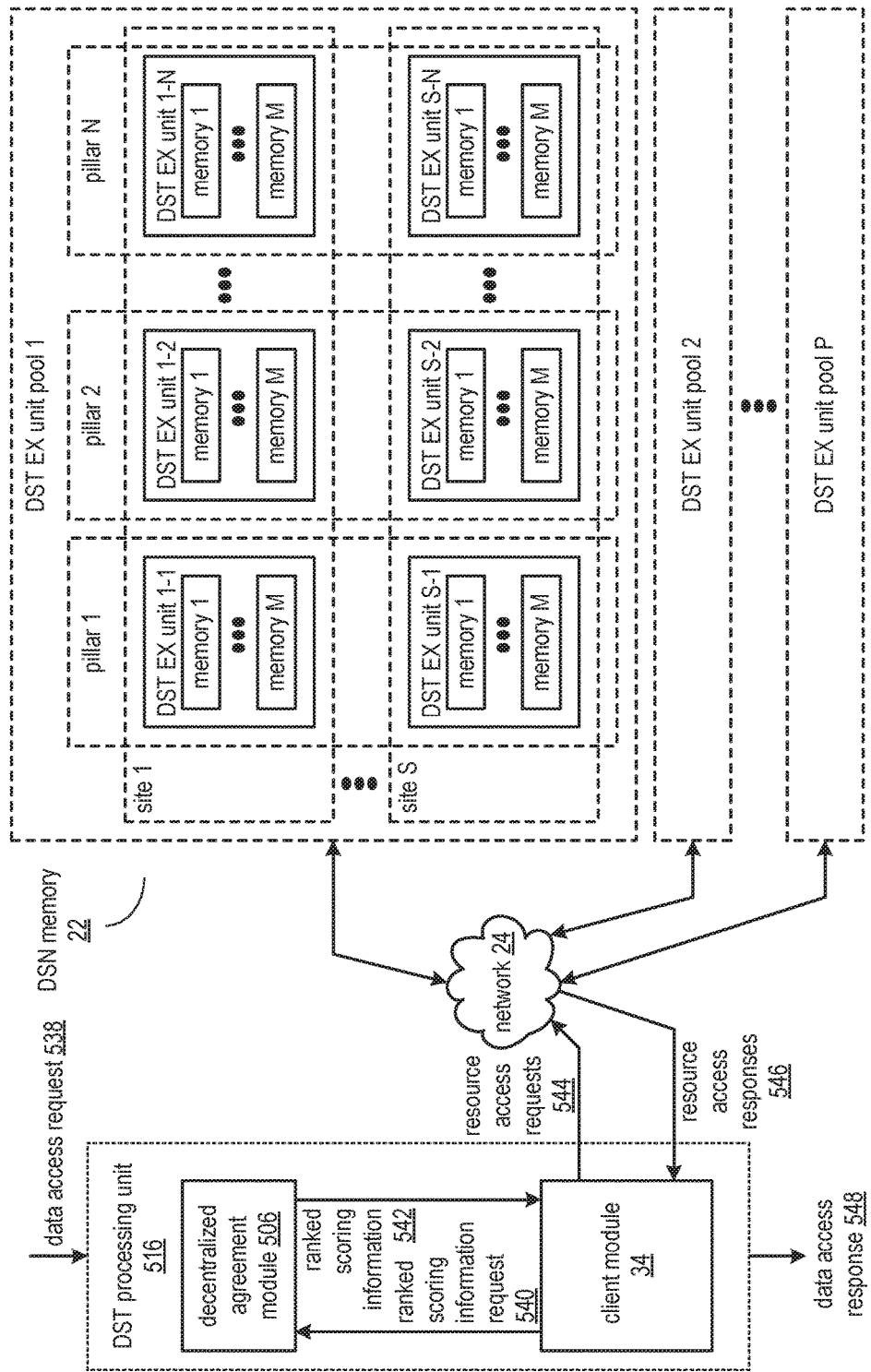
FIG. 11 is a schematic block diagram of an embodiment of a dispersed storage network (DSN) in accordance with the present invention.

FIG. 11 is a schematic block diagram of an embodiment of a dispersed storage network (DSN) that includes the distributed storage and task (DST) processing unit 516, which can include computing device 16 of FIG. 1, the network 24 of FIG. 1, and DSN memory 22 of FIG. 1. The DSN memory 22 includes a plurality of DST execution (EX) unit pools 1-P. The DST processing unit 516 includes a decentralized agreement module 506, and the client module 34 of FIG. 1. The decentralized agreement module 506 may be implemented utilizing the decentralized agreement module 506 of FIG. 9. Each DST execution unit pool includes a plurality of DST execution units. Each DST execution unit may be implemented utilizing a storage unit 36 of FIG. 1. Each DST execution unit may be implemented at one site of S sites. Each DST execution unit may be associated with at least one pillar of N pillars associated with an information dispersal algorithm. Each site may not include every pillar and a given pillar may be implemented at more than one site. Each DST execution unit includes a plurality of memories 1-M.

The DSN functions to receive data access requests 538, select resources of at least one DST execution unit pool for data access, utilize the selected DST execution unit pool for the data access, and issued a data access response 548 based on the data access. The selecting of the resources includes utilizing a decentralized agreement function of the decentralized agreement module 506, where a plurality of locations are ranked against each other. The selecting may include one or more of selecting one storage pool of the plurality of storage pools, selecting DST execution units at various sites of the plurality of sites, selecting a memory of the plurality of memories for each DST execution unit, and selecting combinations of memories, DST execution units, sites, pillars, and storage pools.

In an example of operation, the client module 34 receives the data access request 538 from a requesting entity, where the data access request 538 includes at least one of a store data request, a retrieve data request, a delete data request, a data name, and a requesting entity identifier (ID). Having received the data access request 538, the client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory) based on the data name (e.g., for the retrieve data request).

Having determined the DSN address, the client module 34 selects a plurality of resource levels (e.g., DST EX unit pool, site, DST execution unit, pillar, memory) associated with the DSN memory 22. The determining may be based on one or more of the data name, the requesting entity ID, a predetermination, a lookup, a DSN performance indicator, and interpreting an error message. For example, the client module 34 selects the DST execution unit pool as a first resource level and a set of memory devices of a plurality of memory devices as a second resource level based on a system registry lookup for a vault associated with the requesting entity.

Having selected the plurality resource levels, the client module 34, for each resource level, issues a ranked scoring information request 540 to the decentralized agreement module 506 utilizing the DSN address as an asset ID. The decentralized agreement module 506 performs the decentralized agreement function the asset ID based on locations of the selected resource levels, and location weights of the locations to generate ranked scoring information.

For each resource level, the client module 34 receives corresponding ranked scoring information 542. Having received the ranked scoring information 542, the client module 34 identifies one or more resources associated with the resource level based on the rank scoring information. For example, the client module 34 identifies a DST execution unit pool associated with a highest score and identifies a set of memory devices within DST execution units of the identified DST execution unit pool with a highest score.

Having identified the one or more resources, the client module 34 accesses the DSN memory 22 based on the identified one or more resources associated with each resource level. For example, the client module 34 issues resource access requests 544 (e.g., write slice requests when storing data, read slice requests when recovering data) to the identified DST execution unit pool, where the requests further identify identified set of memory devices. Having accessed the DSN memory 22, the client module 34 receives resource access responses 546 (e.g., write slice responses, read slice responses). The client module 34 issues the data access response 548 based on the received resource access responses 546. For example, the client module 34 decodes received encoded data slices to reproduce data and generates the data access response 548 to include the reproduced data.

Figure 12:
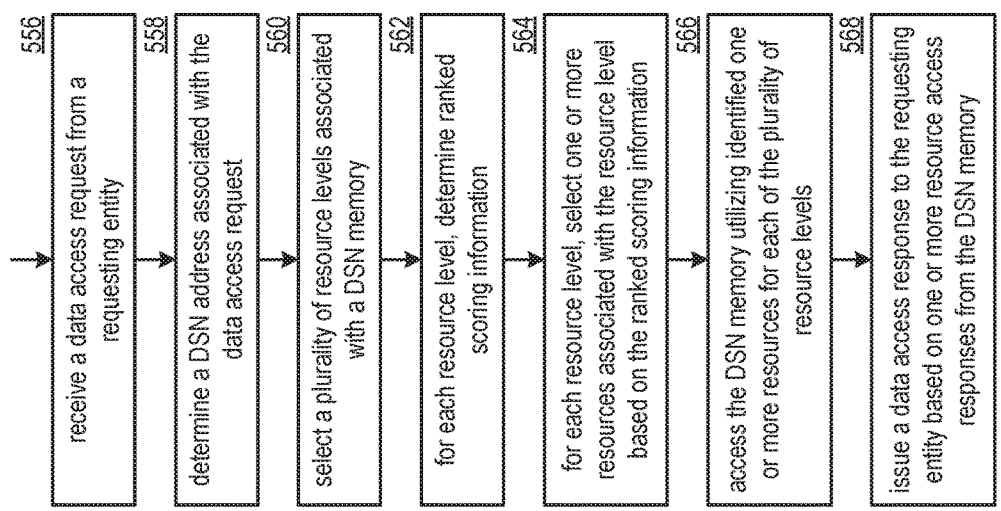
FIG. 12 is a flowchart illustrating an example of accessing a dispersed storage network (DSN) memory in accordance with the present invention.

FIG. 12 is a flowchart illustrating an example of accessing a dispersed storage network (DSN) memory. The method includes step 556 where a processing module (e.g., of a distributed storage and task (DST) client module) receives a data access request from a requesting entity. The data access request includes one or more of the storage request, retrieval request, the requesting entity identifier, and a data identifier. The method continues at step 558 where the processing module determines a DSN address associated with the data access request. For example, the processing module generates the DSN address for the storage request. As another example, the processing module performs a lookup for the retrieval request based on the data identifier.

The method continues at step 560 where the processing module selects a plurality resource levels associated with the DSN memory. The selecting may be based on one or more of a predetermination, a range of weights associated with available resources, a resource performance level, and a resource performance requirement level. For each resource level, the method continues at step 562 where the processing module determines ranked scoring information. For example, the processing module issues a ranked scoring information request to a decentralized agreement module based on the DSN address and receives corresponding ranked scoring information for the resource level.

For each resource level, the method continues at step 564 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 566 where the processing module accesses the DSN memory utilizing the selected one or more resources for each of the plurality resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 568 where the processing module issues a data access response to the requesting entity based on one or more resource access responses from the DSN memory. For example, the processing module issues a data storage status indicator when storing data. As another example, the processing module generates the data access response to include recovered data when retrieving data.

Figure 13:
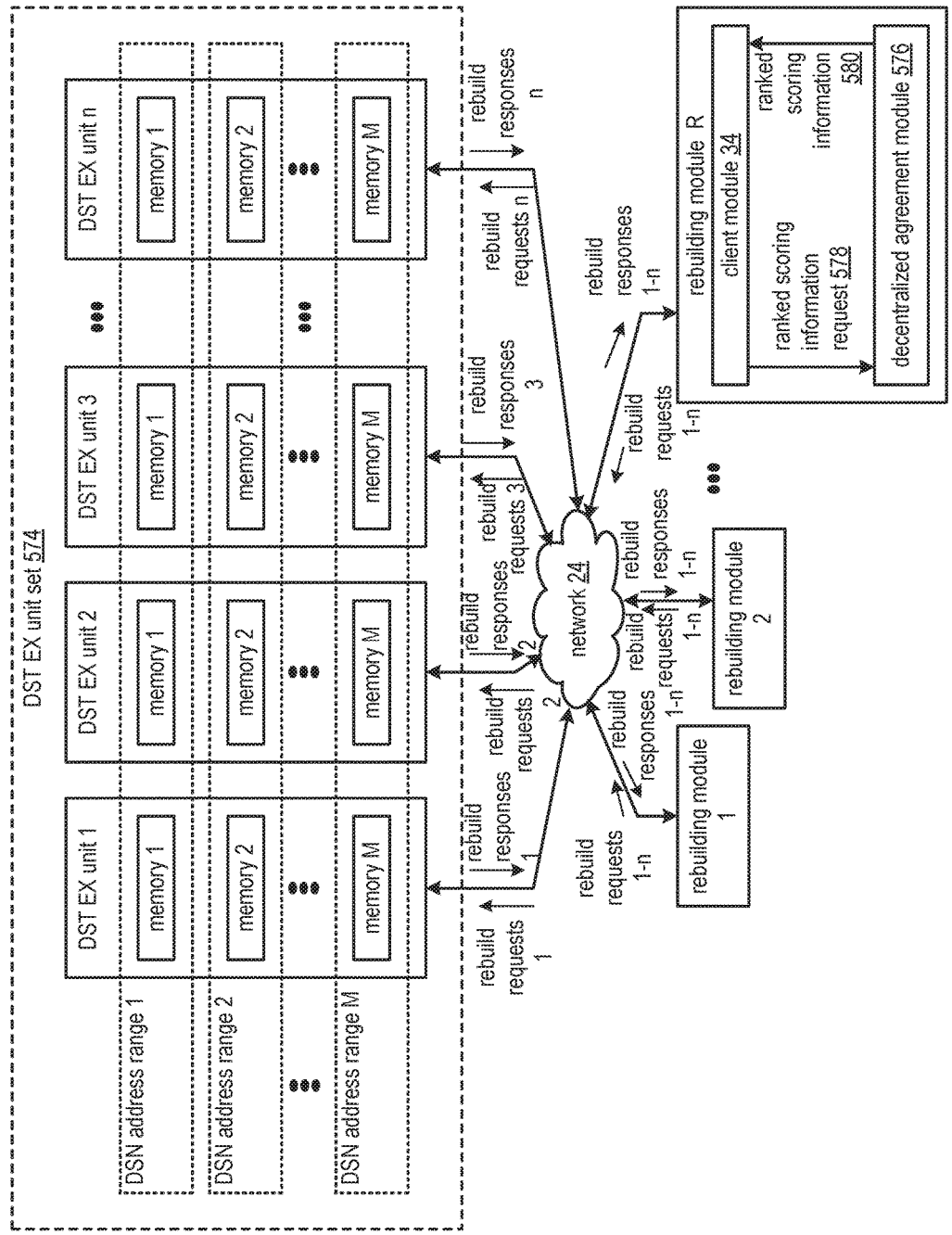
FIG. 13 is a schematic block diagram of another embodiment of a dispersed storage network (DSN) in accordance with the present invention.

FIG. 13 is a schematic block diagram of another embodiment of a dispersed storage network (DSN) that includes a distributed storage and task (DST) execution (EX) unit set 574, the network 24 of FIG. 1, and a plurality of rebuilding modules 1-R. The DST execution unit set 574 includes a set of DST execution units 1-n. Each DST execution unit includes a plurality of memories 1-M. Each DST execution unit may be implemented utilizing a storage unit 36 of FIG. 1. Each memory may be implemented utilizing any of various types of memory storage devices capable of storing encoded data slices. Each rebuilding module may be implemented utilizing one or more of the computing device 16 of FIG. 1, the storage unit 36 of FIG. 1, and the integrity processing unit 20 of FIG. 1. Each rebuilding module includes a client module 34 of FIG. 1 and a decentralized agreement module 576, where the decentralized agreement module 576 may be implemented utilizing the decentralized agreement module 506 of FIG. 9.

The DSN functions to autonomously allocate rebuilding resources, where data is dispersed storage error encoded utilizing an information dispersal algorithm (IDA) function to produce a plurality of sets of encoded data slices for storage in the set of DST execution units 1-n. Each set of encoded data slices is associated with a set of slice names. Each set of slice names falls within a particular DSN address range of a plurality of DSN address ranges 1-M associated with the DST execution unit set 574. Each DSN address ranges associated with a set of memories of the set of DST execution units 1-n. For example, each memory 1 of the DST execution units 1-n is included in a first set of memories and is associated with a DSN address range 1. As such, encoded data slices associated with consecutive slice names of the DSN address range 1 are stored in the first set of memories 1. A set of memories may support more than one DSN address ranges.

In an example of operation of the autonomous allocation of the rebuilding resources, each rebuilding module selects a DSN address range of the plurality of DSN address ranges for rebuilding activities. Each rebuilding module may be associated with one or more DSN address ranges. The selecting includes one or more of interpreting system registry information, receiving rebuilding assignment information, identifying a need for rebuilding, interpreting an error message, a random selection, a round-robin selection, and interpreting a received request. For example, the rebuilding module 1 identifies the DSN address range 1 for the rebuilding activities based on interpreting the system registry information.

Having identified the associated DSN address range, the rebuilding module determines a rebuilding activity capacity level for the selected DS and address range. The determining includes at least one of interpreting a query response, performing a lookup, and receiving the rebuilding activity capacity level from one or more DST execution units of the set of DST execution units 1-n.

Having determined the rebuilding activity capacity level, the rebuilding module determines a maximum number of rebuilding modules for assignment to the selected DSN address range based on the rebuilding activity capacity level. The determining may be based on one or more of performing a lookup, calculating the maximum number based on historical capacity levels, and receiving the maximum number.

Having identified the maximum number of rebuilding modules, the rebuilding module identifies distributed agreement protocol function weights of available rebuilding modules (e.g., "locations" associated with the distributed agreement protocol function). The identifying includes at least one of performing a lookup, initiating a query, interpreting system registry information, interpreting a query response, and receiving. For example, the rebuilding module 1 interprets the system registry information to determine the distributed agreement protocol function weights of the rebuilding modules 1-R.

Having identified the distributed agreement protocol function weights, the client module 34 of the rebuilding module issues a ranked scoring information request 578 to the decentralized agreement module 576 of the rebuilding module, where the request includes the DSN address range (e.g., the asset indicating a starting source name) and the weights of the available rebuilding modules. The decentralized agreement module 576 performs a decentralized agreement protocol function on the DSN address range utilizing the weights of the available rebuilding modules to produce ranked scoring information 580. The ranked scoring information 580 includes a ranked ordering of identifiers of the available rebuilding modules with regards to conducting the rebuilding activities within the DSN address range.

The client module 34 identifies the maximum number of ranked rebuilding modules based on received rank scoring information 580. For example, the client module 34 identifies the two highest ranked rebuilding modules that include rebuilding modules 1 and 3, when the maximum number of ranked rebuilding modules is two and the rebuilding modules 1 and 3 are ranked the highest.

With the rebuilding modules included in the identification of the maximum number of ranked rebuilding modules, the client module of the rebuilding module facilitates the rebuilding activities within the DSN address range. The facilitating includes issuing rebuild requests 1-n to the DST execution unit set, receiving rebuild responses 1-n, and interpreting the received rebuild responses 1-n for further processing. The rebuild requests may include one or more of a list slice request, a store rebuilt slice request, a rebuilding activity capacity query, and a read slice representation request. The rebuild responses may include one or more of a list slice response, a store rebuilt slice request, a rebuilding activity capacity query response, and a read slice representation response. For example, the rebuilding module one issues, via the network 24, rebuild requests 1-n that includes list slice requests to the DST execution units 1-n, receives, via the network 24, rebuild responses 1-n that includes list slice responses, and identifies encoded data slices associated with storage errors by comparing and analyzing the list slice responses.

Figure 14:
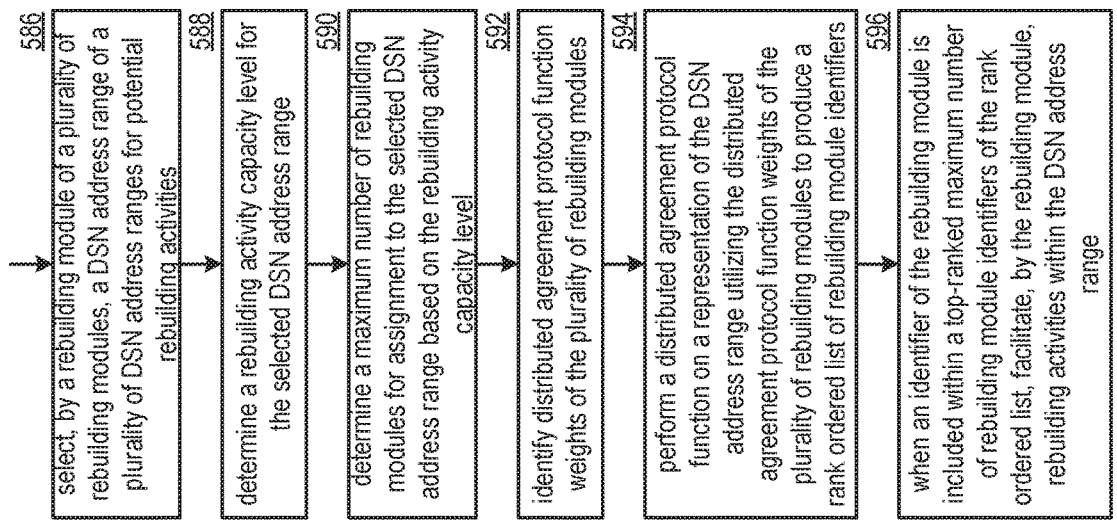
FIG. 14 is a flowchart illustrating an example of autonomous allocation of rebuilding resources in accordance with the present invention.

FIG. 14 is a flowchart illustrating an example of autonomous allocation of rebuilding resources. The method includes step 586 where a rebuilding module of a plurality of rebuilding modules (e.g., of a distributed storage and task (DST) execution unit of a plurality of DST execution units) selects a DSN address range of a plurality of DSN address ranges for potential rebuilding activities. The selecting includes at least one of identifying a next DSN address range of a list of DSN address ranges, performing a random selection, and selecting based on an interpretation of an error message.

The method continues at step 588 where the rebuilding module determines a rebuilding activity capacity level for the selected DS and address range. The determining includes at least one of issuing a query request, interpreting a query response, performing a lookup, initiating a test, interpreting test results, and accessing a historical record.

The method continues at step 590 where the rebuilding module determines a maximum number of rebuilding modules for assignment to the selected DSN address range based on the rebuilding activity capacity level. The determining includes at least one of performing a lookup based on the rebuilding activity capacity level and an expected loading level for each rebuilding module, receiving an indication of the maximum number, and calculating the maximum number utilizing the deterministic function that includes constants derived from historical records.

The method continues at step 592 where the rebuilding module identifies distributed agreement protocol function weights of the plurality of rebuilding modules. The identifying includes at least one of interpreting system registry information, initiating a query, interpreting a query response, and receiving the weights. The method continues at step 594 where the rebuilding module performs a distributed agreement protocol function on a representation of the DSN address range utilizing the distributed agreement particle function weights of the plurality of rebuilding modules to produce a rank ordered list of rebuilding module identifiers. The representation of the DSN address range includes at least one of a data identifier, a slice name, a source name, and a vault identifier. The performing includes issuing a rank scoring information request to a decentralized agreement module and receiving a ranked scoring information response that includes a ranked ordered list of rebuilding module identifiers.

When an identifier of the rebuilding module is included within a top-ranked maximum number of rebuilding module identifiers of the rank ordered list, the method continues at step 596 where the rebuilding module facilitates rebuilding activities within the DSN address range. For example, the rebuilding module indicates to activate the rebuilding module when the identifier of the rebuilding module is included in the top-ranked maximum number of rebuilding module identifiers of the rank ordered list. As another example, when activated, the rebuilding module identifies one or more rebuilding tasks associated with the rebuilding activities and initiates execution of at least some of the one or more identified rebuilding tasks. Alternatively, or in addition to, the rebuilding module updates historical records indicating actual rebuilding activity loading levels corresponding to the execution of the identified rebuilding tasks by the rebuilding module and may further update the distributed agreement protocol function weight associated with the rebuilding module based on an updated rebuilding capacity level of the rebuilding module. For example, the rebuilding module raises the distributed agreement protocol function weight associated with the rebuilding module when the updated rebuilding capacity level has increased.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more of its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) storing encoded data slices in one or more storage units based on DSN address ranges of the encoded data slices, the method comprising:
   selecting, by a processor and associated memory configured to implement a rebuilding module of a plurality of rebuilding modules, a selected DSN address range of a plurality of DSN address ranges for potential rebuilding activities;
   determining, by the rebuilding module, a rebuilding activity capacity level for the selected DSN address range;
   determining, by the rebuilding module, a maximum number of rebuilding modules for assignment to the selected DSN address range based on the rebuilding activity capacity level;
   identifying, by the rebuilding module, distributed agreement protocol (DAP) function weights of the plurality of rebuilding modules
   performing, by the rebuilding module, a DAP function on a representation of the DSN address range utilizing the DAP function weights of the plurality of rebuilding modules to produce a rank ordered list of rebuilding module identifiers; and
   in response to a rebuilding module identifier of the rebuilding module being included within a top-ranked number of rebuilding module identifiers of the rank ordered list, facilitate, by the rebuilding module, rebuilding activities within the DSN address range.

2. The method of claim 1, wherein determining the rebuilding activity capacity level for the selected DSN address range includes:
   determining a rebuild capacity of storage units storing encoded data slices within the selected DSN address range.

3. The method of claim 1, wherein determining the rebuilding activity capacity level for the selected DSN address range includes:
   evaluating historical rebuilding capacity levels associated with the selected DSN address range.

4. The method of claim 1, wherein determining the rebuilding activity capacity level for the selected DSN address range includes:
   initiating a rebuild test; and
   interpreting test results of the rebuild test.

5. The method of claim 1, wherein facilitating rebuilding activities includes:
   identifying one or more rebuilding tasks; and
   initiating execution of the one or more rebuilding tasks.

6. The method of claim 5, further comprising:
   updating historical records to include actual rebuilding activity loading levels corresponding to execution of the one or more rebuilding tasks.

7. The method of claim 5, further comprising:
   updating the DAP function weights associated with the rebuilding module to reflect an updated rebuilding activity capacity level.

8. A distributed storage network (DSN) storing encoded data slices in one or more storage units based on DSN address ranges of the encoded data slices, the DSN comprising:
   a plurality of processing devices, each including a processor and an associated memory, configured to implement a plurality of rebuilding modules;
   at least one rebuilding module of the plurality of rebuilding modules configured to:
      select a selected DSN address range of a plurality of DSN address ranges for potential rebuilding activities;
      determine a rebuilding activity capacity level for the selected DSN address range;
      determine a maximum number of rebuilding modules for assignment to the selected DSN address range based on the rebuilding activity capacity level;
      identify distributed agreement protocol (DAP) function weights of the plurality of rebuilding modules perform a DAP function on a representation of the DSN address range utilizing the DAP function weights of the plurality of rebuilding modules to produce a rank ordered list of rebuilding module identifiers; and
      in response to a rebuilding module identifier of the at least one rebuilding module being included within a top-ranked number of rebuilding module identifiers of the rank ordered list, facilitate, by the at least one rebuilding module, rebuilding activities within the DSN address range.

9. The distributed storage network (DSN) of claim 8, wherein the at least one rebuilding module is further configured to:
determine a rebuild capacity of storage units storing encoded data slices within the selected DSN address range.

10. The distributed storage network (DSN) of claim 8, wherein the at least one rebuilding module is further configured to:
evaluate historical rebuilding capacity levels associated with the selected DSN address range.

11. The distributed storage network (DSN) of claim 8, wherein the at least one rebuilding module is configured to determine the rebuilding activity capacity level for the selected DSN address range by:
initiating a rebuild test; and
interpreting test results of the rebuild test.

12. The distributed storage network (DSN) of claim 8, wherein the at least one rebuilding module is further configured to:
identify one or more rebuilding tasks; and
initiate execution of the one or more rebuilding tasks.

13. The distributed storage network (DSN) of claim 12, wherein the at least one rebuilding module is further configured to:
update historical records to include actual rebuilding activity loading levels corresponding to execution of the one or more rebuilding tasks.

14. The distributed storage network (DSN) of claim 12, wherein the at least one rebuilding module is further configured to:
update the DAP function weights associated with the at least one rebuilding module to reflect an updated rebuilding activity capacity level.

15. A rebuilding module included in a distributed storage network (DSN) storing encoded data slices in one or more storage units based on DSN address ranges of the encoded data slices, the rebuilding module comprising:
a processor and an associated memory configured to:
select a selected DSN address range of a plurality of DSN address ranges for potential rebuilding activities;
determine a rebuilding activity capacity level for the selected DSN address range;
determine a maximum number of rebuilding modules for assignment to the selected DSN address range based on the rebuilding activity capacity level;
identify distributed agreement protocol (DAP) function weights of the plurality of rebuilding modules perform a DAP function on a representation of the DSN address range utilizing the DAP function weights of the plurality of rebuilding modules to produce a rank ordered list of rebuilding module identifiers; and
in response to a rebuilding module identifier of the at least one rebuilding module being included within a top-ranked number of rebuilding module identifiers of the rank ordered list, facilitate, by the at least one rebuilding module, rebuilding activities within the DSN address range.

16. The rebuilding module of claim 15, wherein the at least one rebuilding module is further configured to:
evaluate historical rebuilding capacity levels associated with the selected DSN address range.

17. The rebuilding module of claim 15, wherein the at least one rebuilding module is configured to determine the rebuilding activity capacity level for the selected DSN address range by:
initiating a rebuild test; and
interpreting test results of the rebuild test.

18. The rebuilding module of claim 15, wherein the at least one rebuilding module is further configured to:
identify one or more rebuilding tasks; and
initiate execution of the one or more rebuilding tasks.

19. The rebuilding module of claim 18, wherein the at least one rebuilding module is further configured to:
update historical records to include actual rebuilding activity loading levels corresponding to execution of the one or more rebuilding tasks.

20. The rebuilding module of claim 18, wherein the at least one rebuilding module is further configured to:
update the DAP function weights associated with the at least one rebuilding module to reflect an updated rebuilding activity capacity level.

* * * * *